United States Patent [19]

Hartmann et al.

[11] Patent Number: 4,575,696
[45] Date of Patent: Mar. 11, 1986

[54] METHOD FOR USING INTERDIGITAL SURFACE WAVE TRANSDUCER TO GENERATE UNIDIRECTIONALLY PROPAGATING SURFACE WAVE

[75] Inventors: Clinton S. Hartmann, Dallas, Tex.; William S. Jones, Bramhall, United Kingdom

[73] Assignee: Texas Instruments Incorporated, Dallas, Tex.

[21] Appl. No.: 277,443

[22] Filed: Aug. 2, 1972

Related U.S. Application Data

[62] Division of Ser. No. 69,081, Sep. 2, 1970, Pat. No. 3,686,518.

[51] Int. Cl.$^4$ ................. H03H 9/145; H03H 9/25
[52] U.S. Cl. ................. 333/154; 310/313 B; 333/196
[58] Field of Search ............. 333/30, 72, 150–155, 333/193–196; 310/8, 8.1, 9.7, 9.8, 313, 313 R, 313 A, 313 B, 313 C, 313 D; 331/107 A, 45

[56] References Cited

U.S. PATENT DOCUMENTS 1,917,291  7/1933  Beverage et al. ............. 333/138 X
3,041,547  6/1962  Lehmann et al. .
3,686,518  8/1972  Hartmann et al. ............. 333/30 R Primary Examiner—Marvin L. Nussbaum
Attorney, Agent, or Firm—William E. Hiller; James T. Comfort; Melvin Sharp

[57] ABSTRACT

Disclosed is a unidirectional interdigitated surface wave transducer having at least three discrete arrays of conductive elements, each array comprising, in a comb-like structure, a plurality of electrodes electrically interconnected in parallel and having a periodicity corresponding to one acoustic wavelength of the resonance frequency of the transducer. The discrete arrays of electrodes are deposited upon a piezoelectric substrate in an interleaved pattern to define an interdigitated transducer. Respective electrodes of a given array are substantially equidistantly spaced apart from electrodes of the other arrays and are electrically insulated therefrom. The arrays of electrodes are positioned upon the substrate such that there are at least three electrodes per acoustic wavelength at the resonance frequency. A voltage of different phase is simultaneously applied to each array of electrodes by means of novel broadband phase shifting circuits to generate an acoustic wave that propagates in only one direction along the substrate.

2 Claims, 9 Drawing Figures

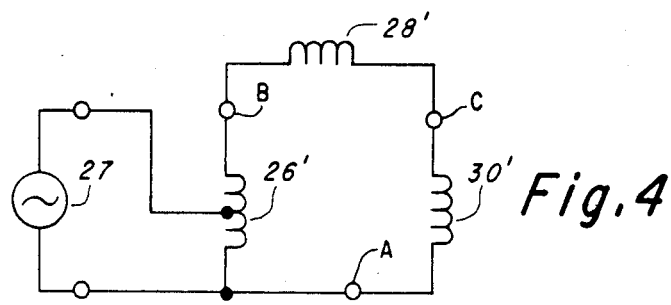
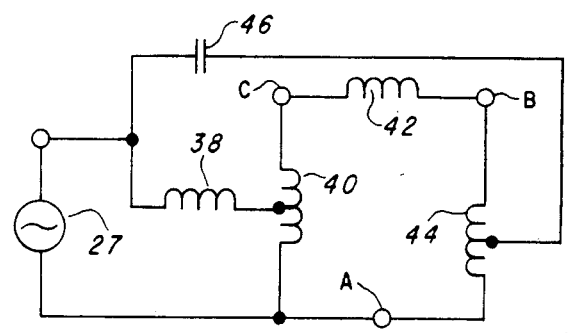
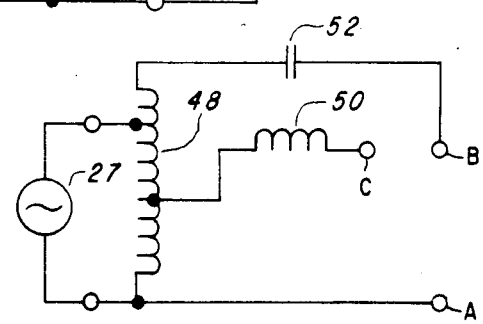
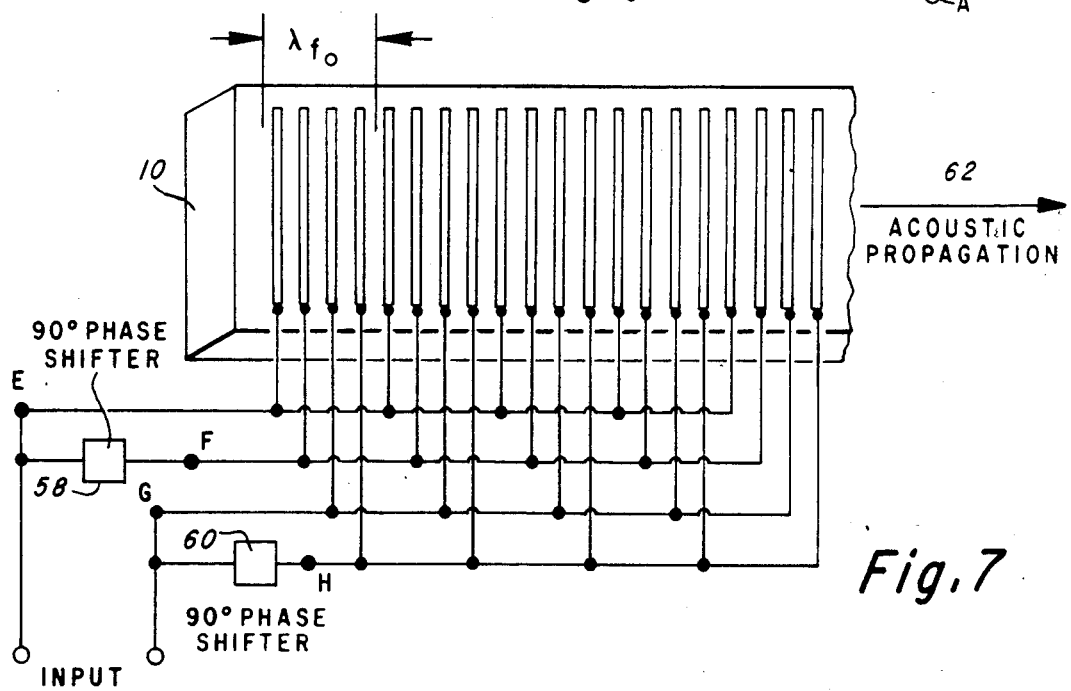

METHOD FOR USING INTERDIGITAL SURFACE WAVE TRANSDUCER TO GENERATE UNIDIRECTIONALLY PROPAGATING SURFACE WAVE

This application is a division of application Ser. No. 69,081, filed Sept. 2, 1970, now U.S. Pat. No. 3,686,518 issued Aug. 22, 1972.

This invention relates to surface wave devices and more specifically to unidirectional transducers and phase shifting circuits for driving same.

The surface acoustic wave technology is ideally suited for applications to a wide range of passive and active signal processing systems—delay lines, matched terminations, attenuators, phase shifters, bandpass filters, pulse compression filters, matched filters, amplifiers, oscillators, mixers, and limiters, due to the ability to tap, guide, amplify, and otherwise manipulate an acoustic wave as it propagates along the surface of a suitable substrate. To date, energy has been coupled to the surface wave by means of an interdigitated transducer having two electrodes per acoustic wavelength deposited on the surface of a piezoelectric substrate. An input transducer converts electrical signals to surface acoustic waves, and an output transducer is used to detect the surface wave and converts it back to an electrical signal. As a result of the bidirectional symmetry of the above described single phase interdigitated transducer, electrical power incident upon the transducer generates two acoustic waves on the substrate which waves propagate from the transducer in opposite directions. Since only one of these waves is normally used in signal processing devices, such devices utilizing these conventional transducers exhibit at least six dB power loss due to bidirectionality. In addition, the unused "backwave" propagating from the transducer must be dampened or absorbed in order to prevent spurious responses in the device's output. Further, a certain portion of the surface wave that is used for the required signal processing is reflected from the output transducer giving rise to triple transit echos which adversely affect the characteristics of the output. Manifestly, a directional transducer that converts all the incident electrical power into a unidirectional acoustic beam would be desirable for applications in signal processing devices since, by reciprocity, incident acoustic power would be transmitted to the electrical load without reflection effecting a device of essentially zero insertion loss and infinite triple transit suppression. Also, the backwave would be very low in amplitude, greatly simplifying the damping requirements.

One method for achieving a single phase unidirectional transducer is described in "Design of Surface Wave Delay Lines with Interdigital Transducers," *IEEE Transactions on Microwave Theory and Techniques*, Vol. MTT-17, No. 11, November 1969, by W. Richard Smith et al. This design utilizes colinear transactions having phase centers that are spaced apart by fifteen and one-quarter wavelengths wherein one of the transducers acts as a parasitic acoustic reflector. As pointed out in the above referenced article, however, directional properties of the array are extremely sensitive to frequency variations making the array useful only where extremely narrow bandwidths are acceptable.

Accordingly it is an object of the present invention to provide an improved unidirectional surface wave transducer having a large bandwidth.

Another object of the invention is to provide a multi-phase unidirectional surface wave transducer.

Briefly and in accordance with the present invention, at least three arrays of electrodes are defined upon a piezoelectric substrate. The arrays are deposited in an interleaved pattern to form an interdigitated transducer having at least three electrodes per acoustic wavelength at the desired resonance frequency of the transducer. The arrays of electrodes are simultaneously driven with voltages of different phase such that components of the acoustic wave generated by the voltages add constructively in one direction of propagation of the acoustic wave but substantially cancel each other in the opposite direction of propagation. When three arrays of electrodes are utilized, thus defining on the substrate three electrodes per acoustic wavelength, the phase of the driving voltage applied to the electrodes of one array differs from the phase of the voltage applied to adjacent electrodes, which are respectively members of different arrays, by 120°. Means for providing the required 120° phase shifts to the input signal for driving the respective arrays of electrodes are also provided. When four arrays of electrodes are used, the phase between voltages applied to successive electrodes within an acoustic wavelength is 90°.

The novel features believed to be characteristic of this invention are set forth in the appended claims. The invention itself, however, as well as other objects and advantages thereof may best be understood by reference to the following detailed description of illustrative embodiments when read in conjunction with the accompanying drawings in which:

FIGS. 3–6 are schematic views of different voltage phase shifting sources suitable for driving the unidirectional transducer depicted in FIGS. 1 and 2;

FIG. 7 is a partially pictorial, partially schematic view of a unidirectional transducer in accordance with one embodiment of the invention wherein respective arrays of electrodes are driven by voltages 90° out of phase;

Figure 1:
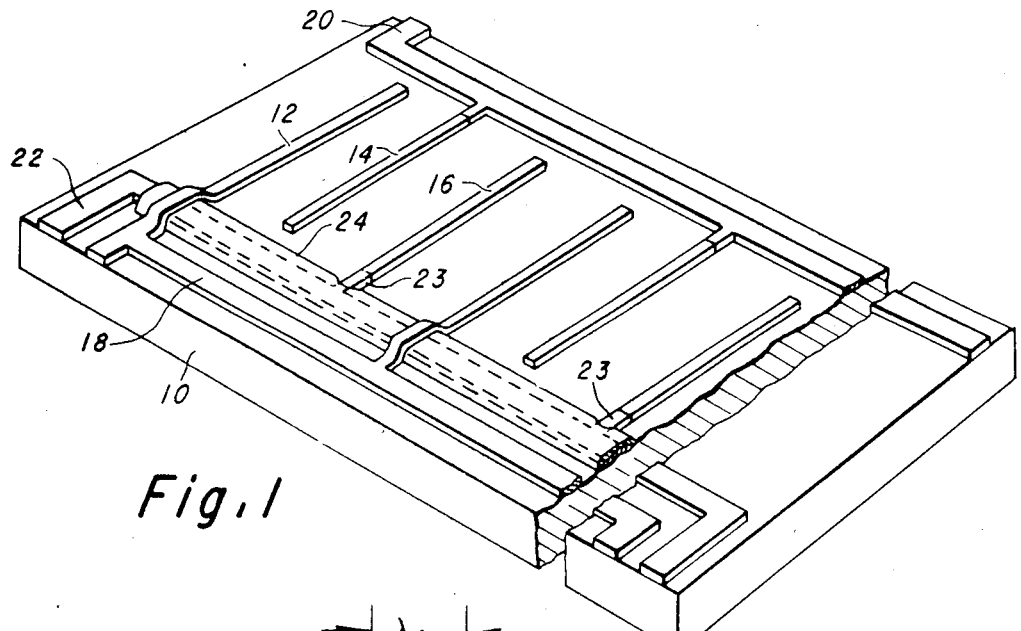
FIG. 1 is a greatly enlarged partially cut away pictorial view of a portion of a unidirectional transducer in accordance with one embodiment of the present invention.

With reference to the drawings, FIG. 1 depicts a preferred embodiment of the invention wherein three arrays of electrodes are deposited upon a surface of a piezoelectric substrate 10. Representative electrodes of the three arrays are shown generally at 12, 14 and 16 respectively. The arrays of electrodes are interleaved such that one electrode from each array is included in successive acoustic wavelengths, thereby defining an interdigitated transducer having three discrete electrodes per acoustic wavelength at the resonance frequency. The substrate 10 may, for example, comprise lithium niobate, quartz, cadmium sulfide, zinc oxide, or any other piezoelectric material known to those skilled in the art to be suitable for propagating acoustic surface waves. The electrodes 12, 14 and 16 of the three arrays are essentially parallel and are electrically isolated one from the other. The electrodes may be comprised of gold, aluminum or other suitable metals. The array of electrodes 12 are commonly connected to a conductive terminal or pad 18 while the arrays of electrodes 14 and 16 are respectively connected to terminals 20 and 22. As shown in FIG. 1, terminal 18 is preferably formed adjacent terminal 22, being electrically insulated therefrom by a layer 24 of insulating material such as silicon oxide. The arrangement of the terminals 18, 20 and 22 with respect to one another is chosen so as to minimize inter-terminal capacitance. Thus, for example, while terminal 18 could be formed to overlie either terminal 20 or 22, such an arrangement would create a relatively large inter-terminal capacitance and cause a distorted transducer output signal. It is to be appreciated, however, that terminal 18 could alternately be formed adjacent terminal 20.

The electrodes of each array, such as electrodes 12, are preferably defined on the surface of the substrate 10 to have a periodicity corresponding to one acoustic wavelength of the resonance frequency. Also, it is preferred that the arrays be formed in an interdigitated pattern such that adjacent electrodes are substantialy equidistantly spaced from one another. While it is not necessary that the electrodes be positioned in this manner, if different periodicity or spacing of electrodes is utilized, the relative phase of the voltage applied to each array will have to be adjusted to effect unidirectional operation of the transducer. Additionally, if more than three electrodes per acoustic wavelength are desired, additional arrays may be formed on the substrate as described in more detail hereinafter.

A unidirectional transducer in accordance with the present invention may have a length of from just a few acoustic wavelengths of the desired resonance frequency up to a large number of wavelengths, depending primarily upon the desired bandwidth. It is to be understood, of course, that if extremely large bandwidths are desired it may not be possible to electrically match the device for low insertion loss operation. However, the advantages of triple transit reduction and elimination of the 6 dB bidirectional loss are still retained. If low insertion loss operation is desired, the coupling coefficient of the substrate material limits the widest bandwidth obtainable. For example, a unidirectional transducer formed on a lithium niobate substrate to have three arrays of electrodes, each array having 5 electrodes, such as electrodes 12, 14 and 16, has a fractional bandwidth of about 20%. This is to be contrasted from the single phase unidirectional transducer described in the aforementioned *IEEE Transactions on Microwave Theory and Techniques* article wherein the bandwidth is limited, for practical purposes, to less than about 5% for a lithium niobate substrate.

Figure 2:
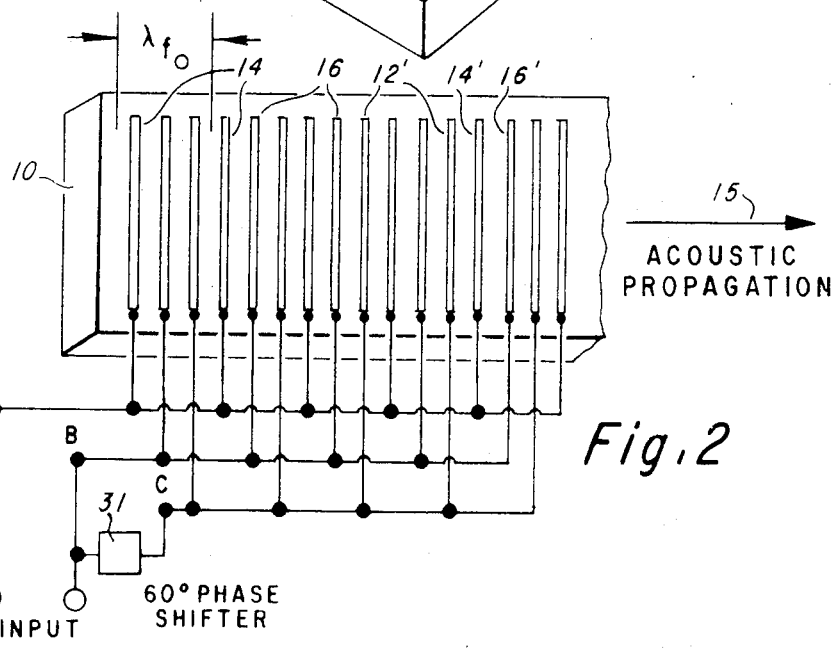
FIG. 2 is a partially pictorial, partially schematic view of a unidirectional transducer in accordance with one embodiment of the invention wherein respective arrays of electrodes are driven by voltages 120° out of phase.

With reference to FIG. 2, there is schematically and pictorially depicted a portion of a unidirectional transducer in accordance with the present invention showing the required electrical connections to the respective arrays of electrodes. While FIG. 2 schematically depicts electrical connections to each of electrodes 12, 14 and 16, it is to be appreciated that this is shown to facilitate description of the circuit and that in practice the individual electrodes would be electrically connected to conductive terminals such as 18, 20 and 22 during metallization, producing a structure as shown in FIG. 1.

As shown, letters A, B, and C depict respectively, contact regions representing terminals 20, 22 and 18 of FIG. 1. With three electrodes per acoustic wavelength it is required that successive pairs of electrodes within a given acoustic wavelength, such as 12 and 14, or 14 and 16, be driven by voltages that differ in phase by 120°. That is, to generate an acoustic wave that propagates only in the direction shown by arrow 15, the voltage applied to, for example, electrode pair 16'-14' should lag the voltage at electrode pair 12'-14' by 120°.

As may be seen, means are required for shifting the phase of the input signal to provide a signal to the array of electrodes 12 having a reference phase while simultaneously applying the same signal, but lagging in phase by 120° to the array of electrodes 14, and the same signal, but lagging in phase by 240°, to the array of electrodes 16. Broad bandwidth circuits for transforming from a single phase input source to a three phase source suitable for use with the unidirectional transducer of the present invention are depicted in FIGS. 3-6. These circuits may be utilized as the 60° phase shifter shown at 31 in FIG. 2. As understood by those skilled in the art, a 60° phase shift may be utilized to produce voltages between terminals A-B, B-C, C-A that differ in phase by 120°.

Figure 3:
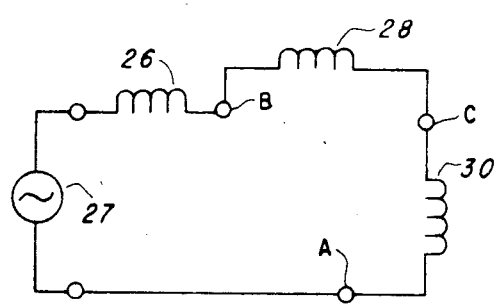

With reference to FIG. 3, the three terminals of the transducer 18, 20 and 22 of FIG. 1, are depicted diagrammatically at C, A and B respectively. A two terminal single phase input signal generator is depicted at 27. One terminal of the source 27 is connected to terminal A of the transducer and the other terminal of the source 27 is connected to inductor 26. Inductor 26 is serially connected between the source 27 and terminal B of the transducer and functions to match the impedance of the source with the impedance of the transducer. Inductors 28 and 30 are chosen to serve a dual function. First, these inductors interact with the internal capacitance of the transducer to tune the device at resonance frequency; that is, match the impedances. Secondly, the inductors provide the necessary 60° phase shift. Inductor 28 is connected between terminals B and C of the transducer while inductor 30 is connected between terminals C and A.

The unidirectional transducer may be used either as an input transducer or an output transducer. When used as an input transducer, the signal source 27 is connected as shown in FIGS. 3-6. When used as an output transducer, however, the signal source 27 is replaced by a load.

In FIG. 4, a modification of the circuit of FIG. 3 is depicted. Here the inductor 26 depicted in FIG. 3 is replaced by inductor 26' which is a tapped inductor. Inductor 26' is connected across terminals B and A of the transducer. One terminal of the source 27 is connected to the tap of the inductor 26' and the other terminal of the source 27 is connected to the terminal A of the transducer. The advantge of this modification is that the transducer can be matched to a wide range of input impedances while the arrangement of FIG. 3 is limited to an intermediate, more narrow input impedance range.

With reference to FIG. 5, a phase shifting circuit is depicted that is useful for matching to very high input impedances. Inductor 42 and tapped inductors 40 and 44 are connected respectively between terminals C-B, C-A, and B-A of the transducer and function to tune out the internal capacitance of the transducer so that the transducer in essence presents a three phase resistive load. Inductor 38 and capacitor 46 function to contribute about a 30° phase shift to the input signal, for a total phase shift of 60°. Capacitance 46 is connected between one terminal of the source 27 and the tap of inductor 44. Inductor 38 is connected at one end to the tap of inductor 40 and at the other end to the junction of capacitor 46 and source 27. The other terminal of the source 27 is connected to terminal A of the transducer.

In FIG. 6 the preferred phase shifting circuit for use with the unidirectional transducer of the present invention is depicted. One terminal of the source 27 is connected to the junction formed by one end of the tapped inductor 48 and terminal A of the transducer. The other terminal of the source 27 is connected electrically to a tap of inductor 48. Capacitor 52 is connected between the other end of inductor 48 and terminal B of the transducer. Inductor 50 is connected intermediate terminal C of the transducer and a second tap of inductor 48. Inductor 50 and capacitor 52 provide the required phase shifting of the input signal. Tapped inductor 48 provides impedance matching between the transducer and input source.

With reference to FIG. 7, a different embodiment of the present invention is depicted wherein four electrodes per acoustic wavelength are utilized. Four terminals are depicted generally at E, F, G and H. An input signal (or load resistance, if the transducer is used as an output transducer) is connected across terminals E and G. Two 90° phase shifters 58 and 60 are utilized, phase shifter 58 being interposed between input line E and transducer terminal F while phase shifter 60 is interposed between input line G and transducer terminal H. In operation phase shifters 58 and 60 interact with the input across E and G to produce at terminal H a voltage that lags the voltage of terminal G by 90°. Similarly, the voltage at terminal G lags the voltage at terminal F by 90° and the voltage of F lags the voltage of E by 90°, producing in response to a single phase signal at E-G, an acoustic surface wave in substrate 10 that propagates only in the direction indicated by arrow 62. Wide band 90° phase shifters are known to those skilled in the art. An example of one such circuit is described in U.S. Pat. No. 3,401,360 granted to E. O. Schulz-DuBois.

The arrays of electrodes, such as electrodes 12, 14 and 16, including terminals 18, 20 and 22 may be formed on the surface of the substrate 10 by any conventional multi-level metallization and masking technique or by other techniques known to those skilled in the art useful for defining a metal pattern. For example, the arrays of electrodes 14 and 16, including the associated terminals 20 and 22 may be formed on the substrate 10 during a first metallization step. The array of electrodes 12 would also be deposited during this step but would be "floating"; that is, they would not be electrically connected to a conductive terminal. An insulating layer could then be formed over a conductive terminal such as 22 and windows etched through the insulator at areas overlying contact areas to electrodes 12. Insulating material, such as $SiO_2$, are well known in the art. A further metallization step could form terminal 18 and make contact through the windows to the array of electrodes 12. Alternately, in the first metallization step, conductive terminal 22 could be formed, as shown in FIG. 1, to have tabs 23. These tabs extend from terminal 22 and subsequently form contact areas for the array of electrodes 16. An insulating layer 24 could then be formed over terminal 22 leaving the tabs 23 exposed. A further metallization step could then be carried out to form terminals 18 and 20 and all of the arrays of electrodes 12, 14 and 16, electrodes 16 contacting tabs 23 of terminal 22. If it is desired to form more than three arrays of electrodes, similar multi-level metallization techniques well known in the art may be utilized to form connections to the electrodes.

Figure 8:
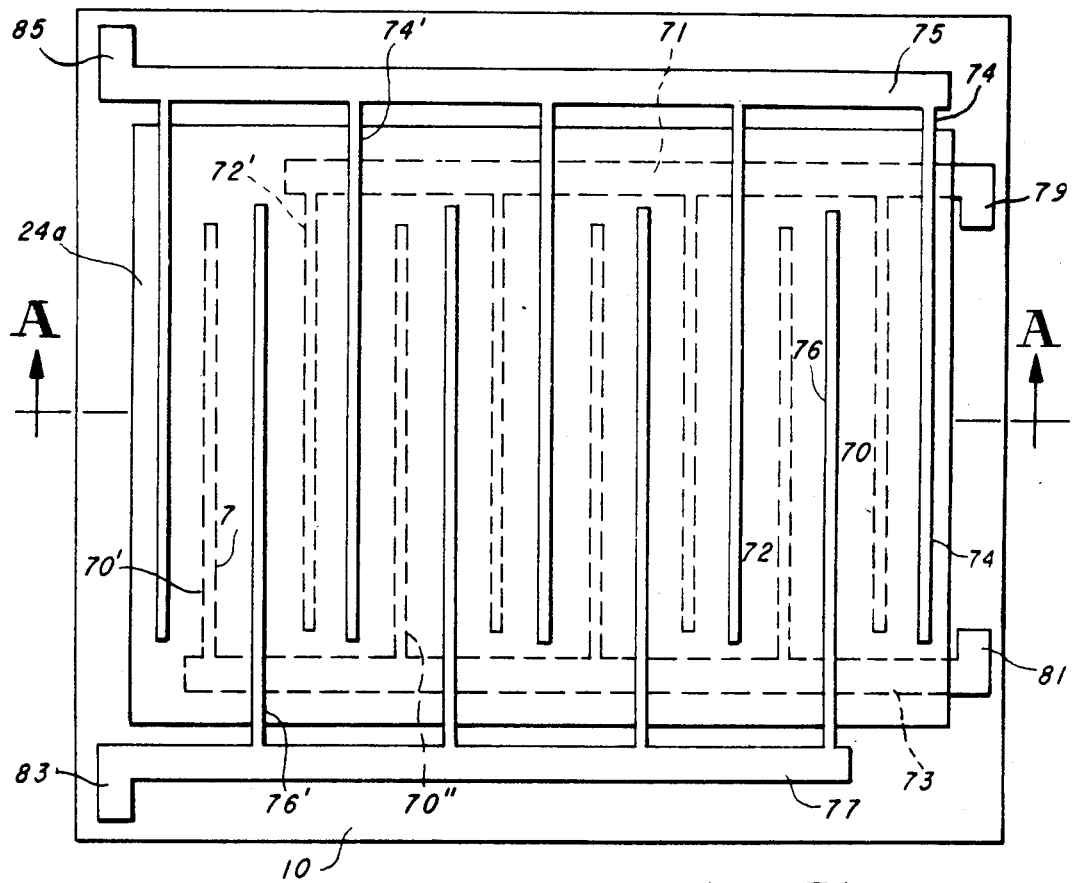
FIG. 8 is a plan view of an embodiment of the present invention wherein the unidirectional transducer comprises a multi-level structure having layers separated by an insulation layer.
Figure 9:
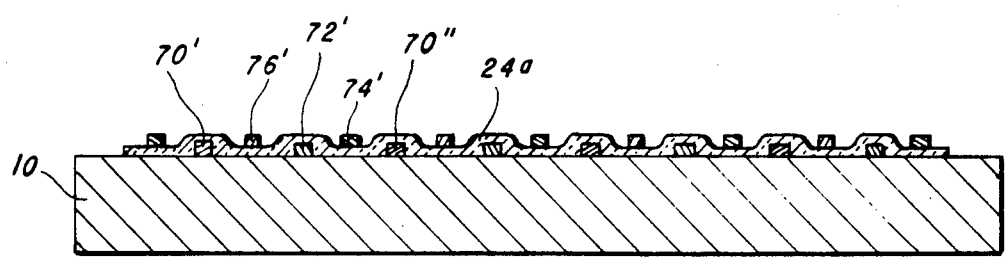
FIG. 9 is a sectional view taken along line A-A' of FIG. 8.

With reference to FIGS. 8 and 9, there is depicted an embodiment of the present invention that is better adapted for mass production techniques. In this embodiment there is depicted a multi-level unidirectional transducer having four electrodes per acoustic wavelength. These electrodes are shown generally at 70, 72, 74 and 76 and are connected respectively to terminals 71, 73, 75 and 77. It is to be appreciated, however, that a multi-phase unidirectional transducer could be formed in accordance with this embodiment to have any desired number of electrodes per acoustic wavelength.

A piezoelectric substrate is shown at 10. In a first metallization step terminals 71 and 73 and associated electrodes 70 and 72 are deposited on the surface of the substrate 10. Terminals 71 and 73 are formed to have connection pads shown at 79 and 81 respectively. Adjacent electrodes such as 70' and 72' are spaced apart by one-half of an acoustic wavelength.

An insulation layer 24a is formed to overlie the electrodes 70 and 72 and terminals 71 and 73, leaving connecting pads 79 and 81 exposed. In a second metallization step, terminals 75 and 77 and associated electrodes 74 and 76 are deposited over the insulation layer 24a. The electrodes 74 connected to terminal 75 are respectively spaced apart by one acoustic wavelength, as are respective electrodes 76 connected to terminal 77. Preferably terminals 75 and 77 are formed on a surface region of the oxide layer 24a overlying an area of the substrate 10 adjacent terminals 71 and 73 respectively. As mentioned previously, if the terminals 75 and 77 are formed to overlie terminals 71 and 73, the inter-terminal capacitance introduces spurious responses in the transducer's output. Electrodes 74 and 76 are respectively formed on the oxide layer 24a in a position that overlies the center portion of an area of the substrate 10 between adjacent electrodes such as 70' and 72' formed during the aforesaid first metallization step. For example, electrode 76' may be formed on an area overlying the space between 70' and 72' while electrode 74' may be formed to overlie the space between electrodes 72' and 70". A pattern of electrodes 70, 72, 74 and 76 formed as above described produces a multi-level unidirectional transducer having four electrodes per acoustic wavelength. Voltages differing in phase by 90° are respectively applied to connecting pads 79, 81, 83 and 85 of terminals 71, 73, 77 and 79 to effect propagation of a unidirectional acoustic beam.

In accordance with the present invention, a unidirectional transducer was fabricated on y-cut z-propagating lithium niobate. Aluminum electrodes were deposited on the surface of the substrate using multi-level masking and metallization techniques to define a center frequency of 10.9 mhz. Three electrodes per acoustic wavelength were utilized. The transducer was constructed to have a length of five acoustic wavelengths. Regular bidirectional transducers were formed at opposite ends of the unidirectional transducer to measure the directional characteristics. A phase shifting circuit as shown in FIG. 3 was utilized to provide the required phased voltages. Inductors 26, 28 and 30 had an inductance in the range of 30–40 $\mu$H. The unidirectional transducer fabricated as above described had a 20 dB front-to-back ratio at the center frequency and a bandwidth of 12% at the 1.5 dB level.

Although specific embodiments of this invention have been described herein it will be apparent to persons skilled in the art that various modifications to the details of construction shown and described may be made without departing from the scope of this invention. In particular, it is noted that various types of transducer weighting known to those skilled in the art, such as removing selected electrodes, varying the electrode periodicity, amplitude weighting the electrodes and varying the width of selected electrodes may be utilized in combination with the teachings of the present invention to obtain desired unidirectional output characteristics.

What is claimed is:

1. A method for using an interdigital surface wave transducer to generate an acoustic surface wave which propagates unidirectionally on the surface of a piezoelectric substrate, said interdigital transducer having a preselected center frequency and including four separate arrays of elongated and substantially parallel electrodes, the respective electrodes of each array separated by one acoustic wavelength of said preselected center frequency, said arrays interleaved such that within each successive acoustic wavelength there is defined an interdigital pattern of electrodes comprising one electrode from each of said four arrays, adjacent electrodes spaced apart by a distance $\lambda/4$ where $\lambda$ is said one acoustic wavelength, comprising the step of simultaneously generating driving electric fields of different phase wherein the phase difference between successive ones of the electric fields is 90° and respectively applying these driving electric fields to successive electrodes to thereby generate in said substrate an acoustic surface wave which propagates unidirectionally, wherein the step of simultaneously generating driving electric fields includes generating from a single input signal a plurality of inputs having a phase difference of 90° between successive ones of the plurality of inputs and respectively applying these inputs to the four successive electrodes included within each acoustic wavelength.

2. A method for using an interdigital surface wave transducer to generate an acoustic surface wave which propagates unidirectionally on the surface of a piezoelectric substrate, said interdigital transducer having a preselected center frequency and including at least three separate arrays of elongated and substantially parallel electrodes, the respective electrodes of each array separated by one acoustic wavelength of said preselected center frequency, said arrays interleaved such that within each successive acoustic wavelength there is defined an interdigital pattern of electrodes comprising one electrode from each of said at least three arrays, adjacent electrodes spaced apart by a fraction of said one acoustic wavelength equal to the number of separate arrays, comprising the steps of simultaneously generating driving electric fields of different phase wherein the phase differences between successive ones of the electric fields are equal and respectively applying these driving electric fields of different phase to successive electrodes included within each acoustic wavelength to thereby generate in said substrate and acoustic surface wave which propagates unidirectionally, wherein the step of simultaneously generating driving electric fields includes generating by phase shifting circuits from a single input signal a plurality of inputs of different phase wherein the phase differences between successive ones of the plurality of inputs are equal and respectively applying these inputs to successive electrodes included within each acoustic wavelength; and matching the impedance of said phase shifting circuits to the impedance exhibited by said arrays of electrodes.

* * * * *